(12) United States Patent
Nakamura et al.

(10) Patent No.: US 9,263,312 B2
(45) Date of Patent: Feb. 16, 2016

(54) JOINING DEVICE AND JOINING POSITION ADJUSTMENT METHOD USING JOINING DEVICE

(75) Inventors: Michikazu Nakamura, Nirasaki (JP); Masahiko Sugiyama, Nirasaka (JP); Hajime Furuya, Koshi (JP); Naoki Akiyama, Nirasaki (JP); Yosuke Omori, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 8 days.

(21) Appl. No.: 14/351,425

(22) PCT Filed: Sep. 13, 2012

(86) PCT No.: PCT/JP2012/074129
§ 371 (c)(1),
(2), (4) Date: Apr. 11, 2014

(87) PCT Pub. No.: WO2013/058053
PCT Pub. Date: Apr. 25, 2013

(65) Prior Publication Data
US 2014/0311653 A1    Oct. 23, 2014

(30) Foreign Application Priority Data

Oct. 21, 2011  (JP) ................. 2011-231672
May 31, 2012  (JP) ................. 2012-124522

(51) Int. Cl.
*B32B 41/00*  (2006.01)
*H01L 21/68*  (2006.01)
*H01L 21/67*  (2006.01)

(52) U.S. Cl.
CPC .......... *H01L 21/68* (2013.01); *H01L 21/67092* (2013.01); *Y10T 156/1744* (2015.01)

(58) Field of Classification Search
CPC ................ H01L 21/68; H01L 21/6838; H01L 21/67259; H01L 2224/80; H01L 21/185; Y10T 156/1744; Y10T 156/10; B32B 41/00; B29C 66/95; B29C 2037/90
USPC ............ 156/64, 350, 360, 362, 367, 378, 379
See application file for complete search history.

(56) References Cited

U.S. PATENT DOCUMENTS

2004/0005212 A1*  1/2004  Wu ............................... 414/757
2011/0214809 A1*  9/2011  Sugiyama .................... 156/285

FOREIGN PATENT DOCUMENTS

| JP | 2010-287816 A | 12/2010 |
| JP | 2011-49450 A | 3/2011 |
| JP | 2011-66283 A | 3/2011 |
| JP | 2011-192828 A | 9/2011 |
| WO | 2004/026531 A2 | 4/2004 |
| WO | 2010/055730 A1 | 5/2010 |

OTHER PUBLICATIONS

International Search Report cited in Japanese Application No. PCT/JP2012/074129 in Japanese.

* cited by examiner

*Primary Examiner* — Michael N Orlando
*Assistant Examiner* — Joshel Rivera
(74) *Attorney, Agent, or Firm* — Nath, Goldberg & Meyer; Jerald L. Meyer

(57) ABSTRACT

A joining device includes a first holding unit configured to load and hold the first member on its top surface; a second holding unit disposed above the first holding unit while facing the first holding unit and configured to hold the second member; and a position adjustment mechanism configured to adjust a joining position between the first member held by the first holding unit and the second member held by the second holding unit. The second holding unit is of a circular plate shape, and the position adjustment mechanism includes four position-adjusting cam members disposed at equal intervals along an outer peripheral surface of the second holding unit, and moves the second holding unit in a horizontal direction.

13 Claims, 7 Drawing Sheets

JOINING DEVICE AND JOINING POSITION ADJUSTMENT METHOD USING JOINING DEVICE

CROSS-REFERENCE TO RELATED APPLICATION

This application is a 35 U.S.C. §371 National Phase Entry Application from PCT/JP2012/074129, filed on Sep. 13, 2012, which claims the benefit of Japan Patent Application Nos. 2011-231672 and 2012-124522, filed on Oct. 21, 2011 and May 31, 2012, in the Japan Patent Office, the disclosure of which is incorporated herein in their entirety by reference.

TECHNICAL FIELD

The present disclosure relates to a joining device for joining a first member and a second member having a plate shape and a joining position adjustment method using the joining device.

BACKGROUND

Recently, along with a demand for a semiconductor device having a thinner thickness and a larger diameter, a joining device for reinforcing a semiconductor wafer (hereinafter, referred to as "wafer"), which joins a glass substrate or another wafer as a reinforcing substrate to the wafer, has been developed.

As the joining device, a joining device, which includes a loading table configured to load a first member having a thin plate shape, a holding plate disposed above the loading table, facing the loading table and configured to hold a second member having a thin plate shape, and a vacuum chambering installed at an outer periphery of the holding plate, has been proposed. In the joining device, first, the holding plate and the vacuum chambering descend to the side of the loading table, and the vacuum chambering and the loading table make contact with each other through a seal ring. Thereafter, a vacuum chamber is formed by the hold plate, the vacuum chambering and the loading table, and an atmospheric gas is exhausted via an opening formed through a side surface of the vacuum chambering to make the interior of the chamber a vacuum atmosphere. Next, the holding plate further descends to the side of the loading table and the joining of the thin plate-shaped first member and second members is performed.

Meanwhile, when the thin plate-shaped first member and second member are joined by using the joining device, there is a problem that voids due to enclosed air occur in a joint surface of both members, whereby the yield or quality of the joined body in which the first member and the second member are joined together decreases. Therefore, in order to solve this problem, a joining device in which a holding plate disposed opposite a loading table is formed with a flexible material and the first member and the second member are joined together while releasing the air exiting between the first member and the second member, has been developed.

The joining device described above can suppress the occurrence of the void in the joined body. However, it is impossible to change and adjust a position of the second member relative to the first member after the first member and the second member are held on the first holding unit and the second holding unit, respectively, before a start of the joining operation. Thus, there is a problem that a position misalignment occurs between the first member and the second member, and therefore, the quality or yield in the joined body decreases.

Some embodiments of the present disclosure provide a joining device capable of obtaining a high-quality joined body in which a first member and a second member are joined together, with no position misalignment between the first member and the second member in the joined body, and a joining position adjustment method using the joining device.

SUMMARY

According to a first embodiment of the present disclosure, there is provided a joining device for joining a first member and a second member having a plate shape, the joining device including: a first holding unit configured to load and hold the first member on its top surface; a second holding unit disposed above the first holding unit while facing the first holding unit and configured to hold the second member; and a position adjustment mechanism configured to adjust a joining position between the first member held by the first holding unit and the second member held by the second holding unit, wherein the second holding unit is of a circular plate shape, wherein the position adjustment mechanism includes four position-adjusting cam members disposed at equal intervals along an outer peripheral surface of the second holding unit, and moves the second holding unit in a horizontal direction.

In the first embodiment of the present disclosure, it is preferred that the position-adjusting cam members are configured to adjust a horizontal position of the second holding unit in such a way that adjacent two position-adjusting cam members as a unit are contacted with or separated from the second holding unit.

In the first embodiment of the present disclosure, it is preferred that the position adjustment mechanism further includes an angle-adjusting cam member configured to press a protrusion formed on an outer peripheral surface of the second holding unit to rotate the second holding unit in a horizontal plane about a center of the circular shape of the second holding unit as a center of rotation.

In the first embodiment of the present disclosure, it is preferred that the first holding unit is of a circular plate shape, wherein the position adjustment mechanism includes four position-adjusting cam member disposed at equal intervals along an outer peripheral surface of the first holding unit, and moves the first holding unit in a horizontal direction.

In the first embodiment of the present disclosure, it is preferred that the position-adjusting cam members are configured to adjust a horizontal position of the first holding unit in such a way that adjacent two position-adjusting cam members as a unit are in contact with or separated from the first holding unit.

In the first embodiment of the present disclosure, it is preferred that the position adjustment mechanism further includes an angle-adjusting member configured to press a protrusion formed on an outer peripheral surface of the first holding unit to rotate the first holding unit in a horizontal plane about a center of the circular shape of the first holding unit as a center of rotation.

In the first embodiment of the present disclosure, it is preferred that the second holding unit is supported to a circular plate body, wherein the position adjustment mechanism includes four position-adjusting cam members disposed at equal intervals along an outer peripheral surface of the circular plate body, and moves the second holding unit by moving the circular plate body in a horizontal direction.

In the first embodiment of the present disclosure, it is preferred that a joining chamber having a bottom chamber and a top chamber coming into contact with the bottom chamber is further provided, wherein the first holding unit and the second holding unit are installed within the bottom chamber and the top chamber, respectively, and the circular plate body is a top plate of the top chamber.

In the first embodiment of the present disclosure, it is preferred that the position-adjusting cam members are configured to adjust a horizontal position of the circular plate body in such a way that adjacent two position-adjusting cam members as a unit are in contact with or separated from the circular plate body.

In the first embodiment of the present disclosure, it is preferred that the position adjustment mechanism further includes an angle-adjusting member configured to press a protrusion formed on an outer peripheral surface of the circular plate body to rotate the circular plate body in a horizontal plane about a center of the circular shape of the circular plate body as a center of rotation.

In the first embodiment of the present disclosure, it is preferred the position-adjusting cam member and the angle-adjusting cam member include: a cylindrical outer peripheral ring; a columnar eccentric cam provided in the outer peripheral ring through a bearing set; and a drive shaft configured to drive the eccentric cam.

In the first embodiment of the present disclosure, it is preferred that a deviation amount measurement mechanism configured to measure a deviation amount of a joining position between the first member held by the first holding unit and the second member held by the second holding unit is further provided.

According to a second embodiment of the present disclosure, there is provided a joining position adjustment method of adjusting a joining position between a first member and a second member having a plate shape in joining the first member and the second member using a joining device, the joining device including: a first holding unit configured to load and hold the first member on its top surface; a second holding unit disposed above the first holding unit while facing the first holding unit and configured to hold the second member; and a position adjustment mechanism configured to adjust a joining position between the first member held by the first holding unit and the second member held by the second holding unit, and wherein the second holding unit is of a circular plate shape, and the position adjustment mechanism includes four position-adjusting cam members disposed at equal intervals along an outer peripheral surface of the second holding unit and an angle-adjusting cam member configured to press a protrusion formed on the outer peripheral surface of the second holding unit to rotate the second holding unit in a horizontal plane about a center of the circular shape of the second holding unit as a center of rotation, the method including: a member holding process of holding the first member and the second member to the first holding unit and the second holding unit, respectively; a deviation amount measuring process of measuring a deviation amount of a position of the second member relative to a position of the first member; a cam separating process of driving adjacent two position-adjusting cam members among the four position-adjusting cam members at a side to which the second member should be moved, to separate the adjacent two position-adjusting cam members from the outer peripheral surface of the second holding unit, based on the measured deviation amount; and a position aligning process of aligning the position of the second member relative to the first member by driving the remaining adjacent two position-adjusting cam members disposed opposite the separated position-adjusting cam members, to press and move the second holding unit, together with the second member held by the second holding unit, to the side the second member should be moved, to correct a horizontal deviation.

In the second embodiment of the present disclosure, it is preferred that an angle adjusting process of rotating the second holding unit in a horizontal plane about the center of the circular shape of the second holding unit as a center of rotation by using the angle-adjusting cam member to correct an angle deviation of the second member relative to the first member, after the position aligning process is further provided.

In the second embodiment of the present disclosure, it is preferred that a centering process of performing a position alignment of the second holding unit relative to the first holding unit by using the position-adjusting cam members, before the member holding process is further provided.

According to the embodiments of the present disclosure, it is possible to obtain a high-quality joined body in which a first member and a second member are joined together, with no position misalignment between the first member and the second member in the joined body.

DETAILED DESCRIPTION

Embodiments of the present disclosure will now be described in detail with reference to the drawings.

Figure 1:
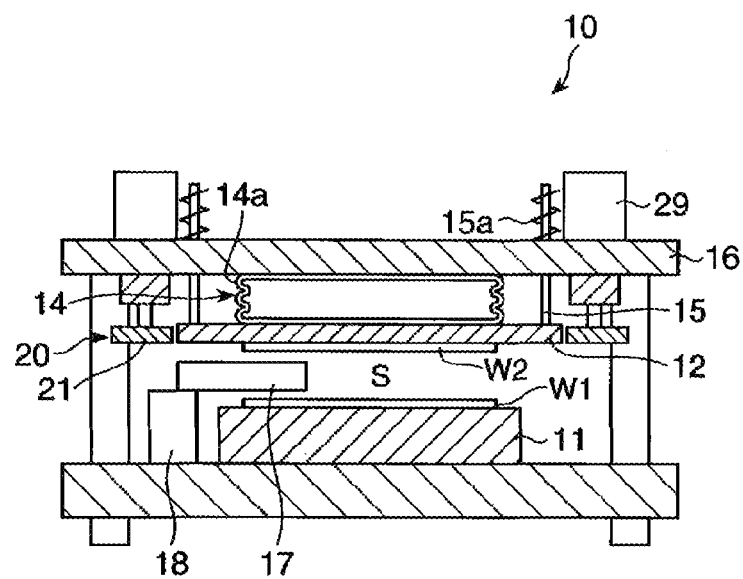
FIG. 1 is a longitudinal sectional view showing a schematic configuration of a joining device according to a first embodiment of the present disclosure.

FIG. 1 is a longitudinal sectional view showing a schematic configuration of a joining device according to a first embodiment of the present disclosure.

In FIG. 1, the joining device 10 includes a lower chuck 11 as a first holder which holds a wafer W1 as a first member on its top surface, and an upper chuck 12 as a second holder which holds a wafer W2 as a second member on its bottom surface. The upper chuck 12 is disposed above the lower chuck 11 facing the same with an interval therebetween.

The wafers W1 and W2 have a circular thin plate shape. The lower chuck 11 and the upper chuck 12, which hold the wafers W1 and W2 respectively, are members having a circular plate shape.

A suction pipe (not shown) configured to attract and hold the wafer W1 is installed within the lower chuck 11. The lower chuck 11 is made of a material having enough strength to avoid its deformation due to a load occurring when joining the wafer W1 to the wafer W2, for example, ceramic such as silicon carbide ceramic, aluminum nitride ceramic and the like.

A moving mechanism (not shown), which moves the lower chuck 11 in a vertical direction, is installed at the bottom surface side of the lower chuck 11. When joining the wafer W1 to the wafer W2, the moving mechanism raises the lower chuck 11 to position the lower chuck 11 closer to the upper chuck 12 in order to form a joining space (not shown). The joining space means a space surrounded by the lower chuck 11, the upper chuck 12 and an O ring (not shown) installed at an outer peripheral portion of a bottom surface of the upper chuck 12 along a circumferential direction of the upper chuck 12.

The upper chuck 12 is suspended from a support plate 16 disposed above the upper chuck 12 by suspension wires 15 as a suspension mechanism. A plurality of, for example, three suspension wires 15 are disposed at equal intervals along the circumferential direction of the upper chuck 12. The suspension wires 15 can be expanded and contracted in a vertical direction by spring members 15a, respectively.

By using the suspension wires 15 as the suspension mechanism, the upper chuck 12 is supported such that the upper chuck 12 can slightly move in a horizontal direction and can rotate by a predetermined angle, for example, 0.4 degrees, about a center of a circular shape of the upper chuck 12, in a non-fixed position state. A suction pipe for attracting and holding the wafer W2 is installed within the upper chuck 12. In addition, a decompression mechanism (not shown) configured to decompress the interior of the joining space is installed on the upper chuck 12.

The upper chuck 12 is made of a material having flexibility in a certain degree, for example, duralumin. Thus, in joining the wafer W1 to the wafer W2, a portion of the wafer W2, for example, a center portion thereof can be first contacted with a wafer W1, and then, portions other than the center portion can be sequentially contacted with the wafer W1. In this manner, it is possible to prevent air from remaining in the joining space of the wafer W1 and the wafer W2 to suppress the generation of voids.

A surveillance camera 17 as a deviation amount measurement mechanism configured to measure the amount of deviation in position between the wafer W1 held by the lower chuck 11 and the wafer W2 held by the upper chuck 12 is installed within a space S between the lower chuck 11 and the upper chuck 12 before the joining space is formed. A well-known camera is applied as the surveillance camera 17.

The surveillance camera 17 is disposed to be able to advance to the space S and retract from the space S by a support base 18. After the wafer W1 is held by the lower chuck 11 and the wafer W2 is held by the upper chuck 12, the surveillance camera 17 advances to the interior of the space S to measure the deviation amount between the wafer W1 and the wafer W2, and then retracts from the interior of the space S. Based on the measured deviation amount, the upper chuck 12 is moved in a predetermined direction over a predetermined width together with the wafer W2 held by the upper chuck 12 to correct the position deviation.

A position adjustment mechanism 20 is installed to be adjacent to the upper chuck 12. The position adjustment mechanism 20 has a plurality of cam members 21. The cam members 21 are driven by motors 29 as a driving source disposed on top of the support plate 16, respectively.

A pressurization mechanism 14 having a flexible container 14a is installed between the upper chuck 12 and the support plate 16. The pressurization mechanism 14 is used in joining the wafer W2 to the wafer W1. By introducing a pressurized fluid into the flexible container 14a, the pressurization mechanism 14 expands downward to press the upper chuck 12 toward the lower chuck 11.

Figure 2:
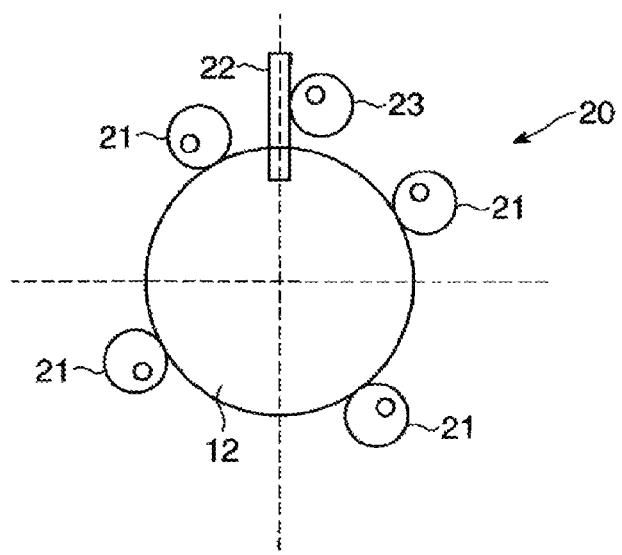
FIG. 2 is a plan view showing a schematic configuration of a position adjustment mechanism in FIG. 1.

FIG. 2 is a plan view showing a schematic configuration of the position adjustment mechanism 20 in FIG. 1.

In FIG. 2, the position adjustment mechanism 20 includes four position-adjusting cam members 21 disposed at equal intervals, that is, 90 degree intervals along the outer peripheral surface of the upper chuck 12 having a circular plate shape. The position-adjusting cam members 21 move the upper chuck 12 in the horizontal direction. The position adjustment mechanism 20 further includes an angle-adjusting cam member 23, which is configured to rotate the upper chuck 12 about the center of the circular shape of the upper chuck 12 by contacting the side surface of a rotation-assisting member 22 that is a protrusion formed on the outer peripheral surface of the upper chuck 12 and pressing the rotation-assisting member 22 in a predetermined direction. The angle-adjusting cam member 23 is driven at a distance from the outer peripheral surface of the upper chuck 12.

A biasing mechanism (not shown) configured to return the rotation-assisting member 22 up to a predetermined reference position when the pressurizing force by the angle-adjusting cam member 23 is no longer applied is installed at the rotation-assisting member 22. The biasing mechanism is made of an elastic body such as a spring member and the like.

The position-adjusting cam members 21 and the angle-adjusting cam member 23 (hereinafter, simply referred to as "cam member 21" and "cam member 23", respectively) are different in position and function for the upper chuck 12, but they have the same structure.

Figure 3:
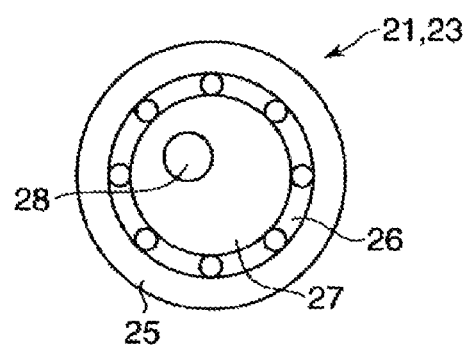
FIG. 3 is a plan view showing a configuration of cam members of the position adjustment mechanism in FIG. 1.

FIG. 3 is a plan view showing the configuration of the cam members 21 and the cam member 23 of the position adjustment mechanism 20 in FIG. 1.

In FIG. 3, the cam members 21 or the cam member 23 includes a cylindrical outer peripheral ring 25, a columnar eccentric cam 27 provided in the outer peripheral ring 25 through a bearing set 26, and a drive shaft 28 configured to drive the eccentric cam 27. The drive shaft 28 is driven by the motor 29 (see FIG. 1).

Figure 4A:
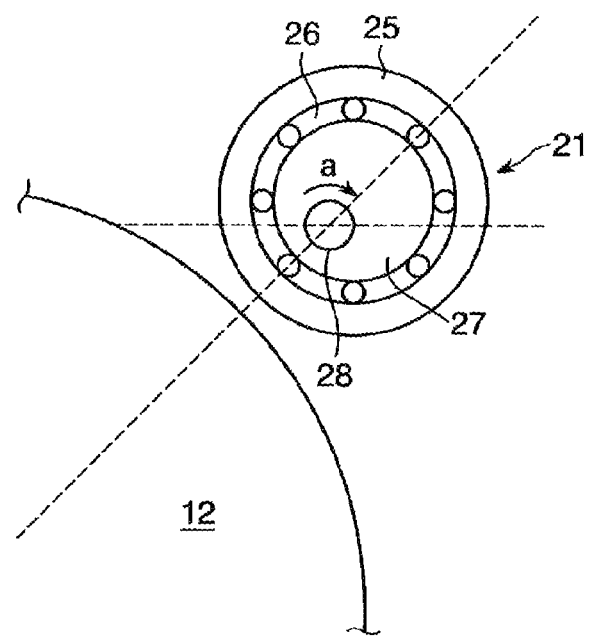
FIG. 4A is a diagram illustrating a function of the cam members in FIG. 2.
Figure 4B:
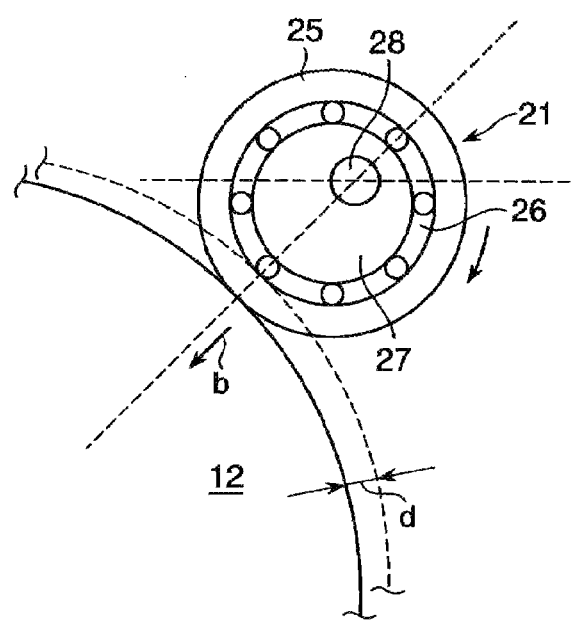
FIG. 4B is a diagram illustrating a function of the cam members in FIG. 2.

FIGS. 4A and 4B are diagrams illustrating a function of the cam members in FIG. 2.

In FIG. 4A, the cam members 21 are separated from the outer peripheral surface of the upper chuck 12. In this state, when the drive shaft 28 is rotated in a direction of an arrow a, the eccentric cam 27 is rotated in the same direction by the rotation of the drive shaft 28. At this time, since the eccentric cam 27 is eccentric, as shown in FIG. 4B, the position of the outer peripheral ring 25 varies, and the outer peripheral surface of the outer peripheral ring 25 makes contacts with the outer peripheral surface of the upper chuck 12. Thus, the upper chuck 12 is pressed in a direction of an arrow b and is displaced by a predetermined width d.

Figure 5:
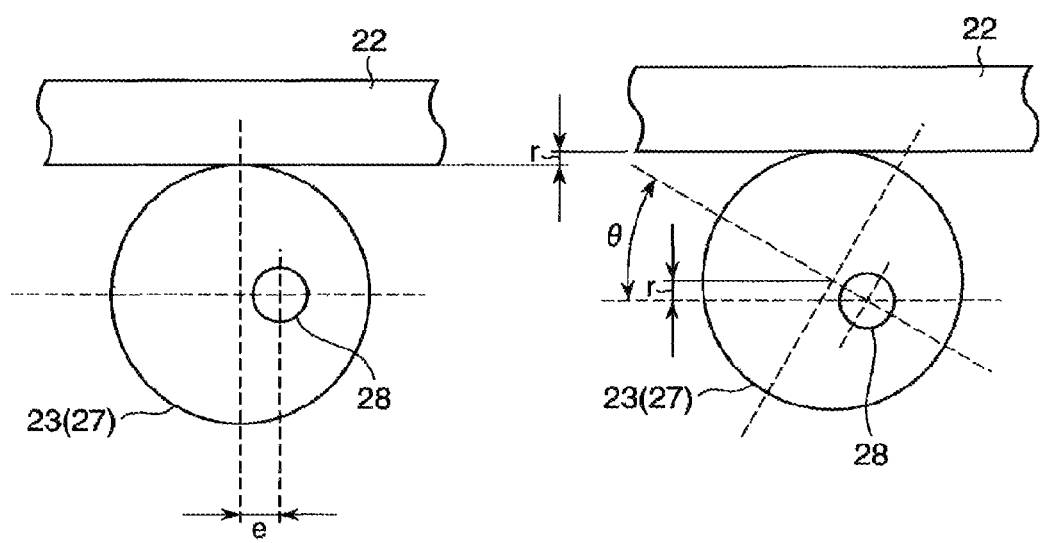
FIG. 5 is a diagram illustrating a relationship between an eccentricity of an eccentric cam and a displacement of a contact member in the cam members in FIG. 2.

FIG. 5 is a diagram illustrating a relationship between the eccentricity of the eccentric cam of the cam members in FIG. 2 and displacement of a contact member.

In FIG. 5, a pressing amount of the cam member 23, that is, displacement r of the contact member 22 is calculated by the following equation 1, where the eccentricity of the drive shaft 28 in the eccentric cam 27 is e and the rotational angle of the eccentric cam 27 is θ.

$$r = e \times \sin \theta \quad (1)$$

From equation 1, it is understood that the pressing amount proportional to the eccentricity of the drive shaft 28 is obtained, regardless of the diameter of the eccentric cam 27 of the cam member 23, and the pressing amount is larger as the eccentricity is larger.

The cam members 21 and the cam member 23 repeat a contact and a separation for the upper chuck or the rotation-assisting member 22 to press and move the upper chuck 12 in an arbitrary direction, or to rotate the upper chuck 12 by a predetermined angle about the center of the circular shape of the upper chuck 12 as the center of rotation. A width of the displacement of the upper chuck 12 by the cam member 21 is, for example, −1 mm to +1 mm, and a displacement accuracy of the upper chuck 12 by the cam member 21 is, for example, ±30 μm. A width of the rotational angle of the upper chuck 12 by the cam member 21 is, for example, −0.2 degrees to +0.2 degrees, and a rotational accuracy of the upper chuck 12 by the cam member 21 is, for example, ±0.02 degrees.

In the joining device 10 having this configuration, the adjustment of the joining position is performed in joining the wafer W1 as the first member to the wafer W2 as the second member.

Figure 6A:
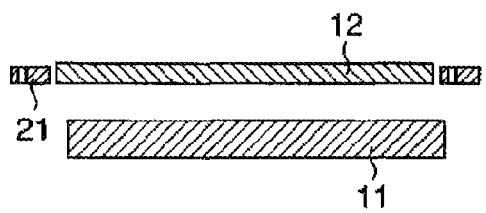
FIG. 6A is a diagram illustrating a part of processes of a joining position adjustment method according to the embodiment of the present disclosure.
Figure 6B:
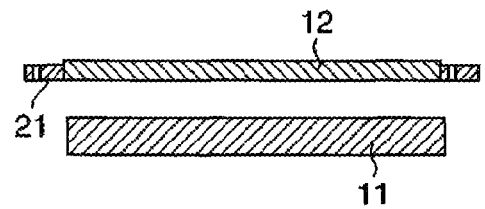
FIG. 6B is a diagram illustrating a part of processes of a joining position adjustment method according to the embodiment of the present disclosure.
Figure 6C:
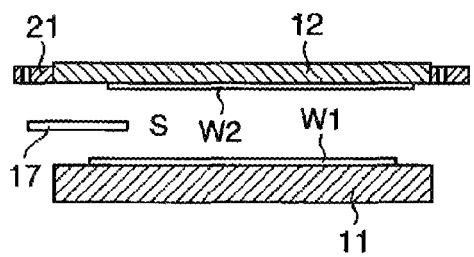
FIG. 6C is a diagram illustrating a part of processes of a joining position adjustment method according to the embodiment of the present disclosure.
Figure 6D:
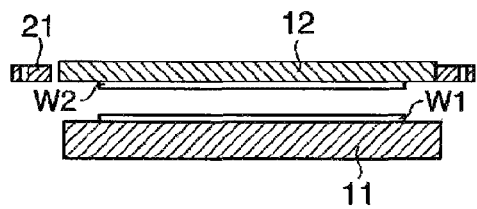
FIG. 6D is a diagram illustrating a part of processes of a joining position adjustment method according to the embodiment of the present disclosure.
Figure 6E:
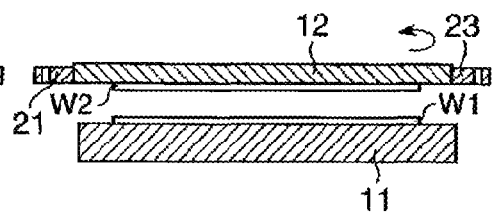
FIG. 6E is a diagram illustrating a part of processes of a joining position adjustment method according to the embodiment of the present disclosure.

FIGS. 6A to 6G are diagrams illustrating a part of the process of the joining position adjustment method according to the embodiment of the present disclosure, and FIGS. 7A to 7F are plan views showing the movement of the cam members in the processes of FIGS. 6D and 6E.

The joining position adjustment method according to the embodiment of the present disclosure will be described with reference to FIGS. 6A to 6G and FIGS. 7A to 7F. The joining position adjustment method is a method of adjusting the joining position when joining a Si wafer (hereinafter, referred to as "wafer W2") having a circuit to a Si support wafer (hereinafter, referred to as "wafer W1").

When adjusting the joining position, an initial state is made, in which the lower chuck 11 and the upper chuck 12 face each other at a distance therebetween and four cam members 21 of the position adjustment mechanism 20 are separated from the outer peripheral surface of the upper chuck 12 (FIG. 6A). At this time, the upper chuck 12 is heated up to, for example, a curing temperature of an adhesive for joining the wafer W1 and the wafer W2. Therefore, in the initial state before performing the joining position adjustment method, an adverse effect caused by an indirect heating of the cam members 21 can be avoided by separating the upper chuck 12 from the cam members 21.

In the initial state, first, two cam members 21 are driven to horizontally move the upper chuck 12 in a predetermined direction by a predetermined width. Thus, the position alignment of the upper chuck 12 relative to the lower chuck 11 is performed (centering process) (FIG. 6B). In addition, the movement of the upper chuck 12 is performed in accordance with the position alignment process to be described later.

Next, the wafer W1 is carried into the joining device 10 to be loaded on a top surface of the lower chuck 11, and the wafer W2 is carried into the joining device 10 to be suction-held on a bottom surface of the upper chuck 12 by a suction-holding pipe (member holding process). Thereafter, an amount of deviation in position of the wafer W2 relative to the position of the wafer W1 is measured by the surveillance camera 17 (deviation amount measuring process) (FIG. 6C). The "deviation" includes a deviation in a horizontal direction (hereinafter, referred to as "horizontal deviation") and a deviation in the rotational direction (hereinafter, referred to as "angular deviation").

Next, the position alignment of the wafer W2 relative to the wafer W1 is performed by moving the upper chuck 12 in a predetermined direction together with the wafer W2 held by the upper chuck 12, based on the deviation amount obtained by the surveillance camera 17 (FIG. 6D).

Figure 7A:
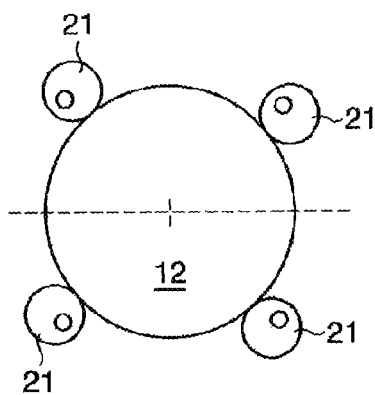
FIG. 7A is a plan view showing the movement of the cam members in the processes of FIGS. 6D and 6E.
Figure 7D:
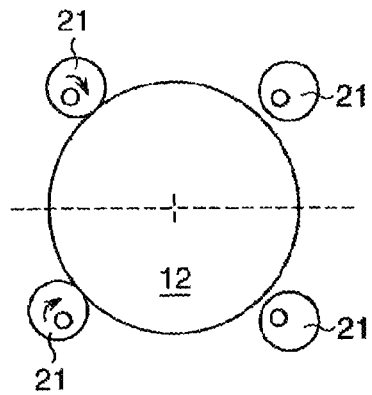
FIG. 7D is a plan view showing the movement of the cam members in the processes of FIGS. 6D and 6E.
Figure 7B:
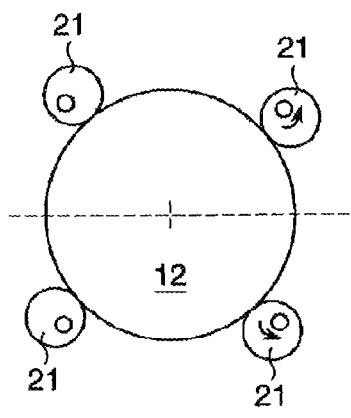
FIG. 7B is a plan view showing the movement of the cam members in the processes of FIGS. 6D and 6E.
Figure 7E:
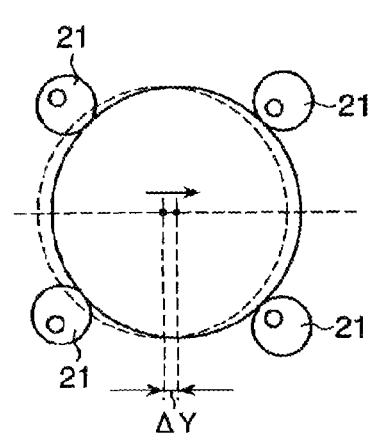
FIG. 7E is a plan view showing the movement of the cam members in the processes of FIGS. 6D and 6E.
Figure 7C:
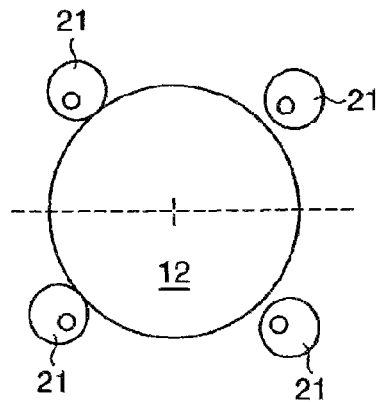
FIG. 7C is a plan view showing the movement of the cam members in the processes of FIGS. 6D and 6E.
Figure 7F:
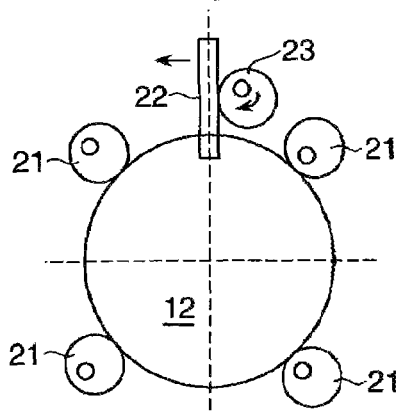
FIG. 7F is a plan view showing the movement of the cam members in the processes of FIGS. 6D and 6E.

That is, among the four cam members 21 (see FIG. 7A) in contact with the outer peripheral surface of the upper chuck 12, two adjacent cam members 21 at a side to which the wafer W2 should be displaced are driven (see FIG. 7B), to allow the outer peripheral surfaces of the two adjacent cam members 21 to be separated from outer peripheral surface of the upper chuck 12 (cam separating process) (see FIG. 7C).

Next, the other two adjacent cam members 21 disposed opposite the separated two cam members 21 are driven to allow the outer peripheral surface of the upper chuck 12 to be pressed by the outer peripheral surfaces of the other two cam members 21 (see FIG. 7D). Thus, the upper chuck 12 together with the wafer W2 held by the upper chuck 12 is pushed to allow the wafer W2 to be displaced by a predetermined width ΔY to the side to which the wafer W2 should move (see FIG. 7E). Therefore, the position of the wafer W2 held by the upper chuck 12 is aligned to the position of the wafer W1 held by the lower chuck 11 (position aligning process).

Next, the angle adjustment is performed as necessary. That is, even when the position (outward shape) of the horizontal direction of the wafer W2 held by the upper chuck 12 matches the position (outward shape) of the wafer W1 held by the lower chuck 11, for example, there is a case where the position between a notch formed on the wafer W2 and a notch formed on the wafer W1 (both not shown) are not matched. In this case, the angle-adjusting cam member 23 is driven to press the side surface of the rotation-assisting member 22 formed on the outer peripheral surface of the upper chuck 12 in a predetermined direction by the outer peripheral surface of the cam member 23 (see FIG. 7F). Thus, the upper chuck 12 is rotated by a predetermined angle about the center of the circular shape of the upper chuck 12 as a center of rotation to adjust the angle of the wafer W2 relative to the wafer W1. Thus, the position between the notches is aligned (angle adjusting process) (FIG. 6E).

The angle adjusting process is performed in a state where the outer peripheral surfaces of the four cam members 21 are respectively in contact with the outer peripheral surface of the upper chuck 12. Thus, it is possible to prevent the deviation between the center of the circular shape of the upper chuck 12 and the center of rotation, whereby the notch of the wafer W2 can be aligned with the notch of the wafer W1 by accurately rotating the upper chuck 12.

Figure 6F:
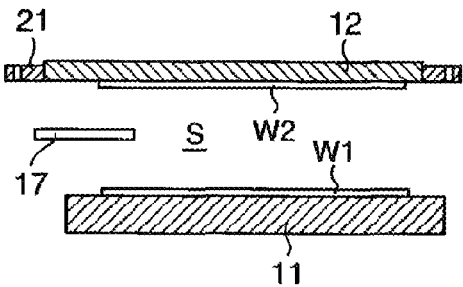
FIG. 6F is a diagram illustrating a part of processes of a joining position adjustment method according to the embodiment of the present disclosure.
Figure 6G:
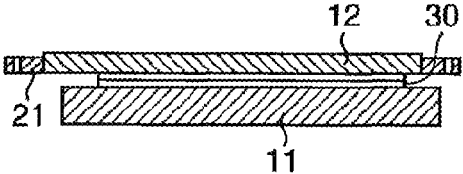
FIG. 6G is a diagram illustrating a part of processes of a joining position adjustment method according to the embodiment of the present disclosure.

Next, the horizontal deviation and the angle deviation between the wafer W1 and the wafer W2 are re-measured by advancing the surveillance camera 17 into the space S (FIG. 6F). As a result of the measurement, when the horizontal deviation and the angle deviation between the wafer W1 and the wafer W2 have been corrected, the upper chuck 12 is pressed toward the lower chuck 11 by using the pressurization mechanism 14 (see FIG. 1). Thus, the wafer W2 and the wafer W1 are joined to obtain a joined body 30 (FIG. 6G).

On the other hand, as a result of measuring the deviation amount, when the horizontal deviation or the angle deviation between the wafer W2 and the wafer W1 are not corrected, the position of the wafer W2 relative to the position of the wafer W1 is aligned by readjusting the joining position, and then the joining process is performed.

According to the present embodiment, even after the wafer W1 and the wafer W2 are held by the upper chuck 12 and the lower chuck 11 respectively, the position alignment between the wafer W1 held by the lower chuck 11 and the wafer W2 held by the upper chuck 12 can be performed by the position adjustment mechanism 20. Therefore, it is possible to obtain the joined body 30 having high quality by removing the position deviation between the wafer W1 and the wafer W2 in the joined body 30.

Also, according to the present embodiment, the position adjustment mechanism 20 has the four position-adjusting cam members 21, which are disposed at equal intervals along the outer peripheral surface of the upper chuck 12. Thus, the two adjacent cam members 21 at the side to which the upper chuck 12 should move are separated from the upper chuck 12, and in this state, the other two cam members 21 are driven to press and move the upper chuck 12 in a direction in which the upper chuck 12 is required to move. Thus, a direction in which the upper chuck 12 pressed by the adjacent two cam members 21 can move is, for example, a direction of 270 degrees. Thus, it is possible to remarkably improve the controllability of the position adjustment mechanism 20.

Further, according to the present embodiment, since the position adjustment mechanism 20 has the angle-adjusting cam member 23, it is possible to easily correct the angle deviation by pressing the rotation-assisting member 22 installed on the upper chuck 12 in a predetermined direction by the cam member 23. Therefore, it is possible to align the wafer W2 to the wafer W1. In the present embodiment, the angle deviation of the wafer W2 relative to the wafer W1 means a position deviation of a circumferential direction between the notch formed on the wafer W2 and the notch formed on the wafer W1. Therefore, the angle adjustment is required to match the position of the notch formed on the wafer W2 and the position of the notch formed on the wafer W1 by removing the position deviation between the notches.

Further, according to the embodiment, the bearing set 26 is installed between the outer ring 25 and the eccentric cam 27 in the cam members 21 and 23. Thus, since a rotational movement of the eccentric cam 27 is not transmitted to the outer ring 25, a sliding surface is not formed on a contact surface between the outer ring 25 and the contact member, for example, the upper chuck 12 and the rotation-assisting member 22. Therefore, it is possible to prevent abrasion of the outer peripheral surface of the upper chuck 12 and the side surface of the rotation-assisting member 22 as well as the outer peripheral surface of the outer ring 25 of the cam members.

Although the joining the wafer W2 to the wafer W1 is described in the present embodiment, the present disclosure is not limited thereto. The wafer W may be joined to a glass substrate G, and the members to be joined for obtaining the joined body 30 are not particularly limited.

Further, although in the present embodiment, as the cam members 21 and 23, the cam member including the bearing set 26 and having a structure where a sliding movement does not occur on the contact surface between the outer ring 25 and the contact member in contact with the outer ring 25 is used, it is also possible to use the well-known cam member in which a sliding movement occurs on its contact surface with the contact member, as the cam members 21 and 23.

Figure 8:
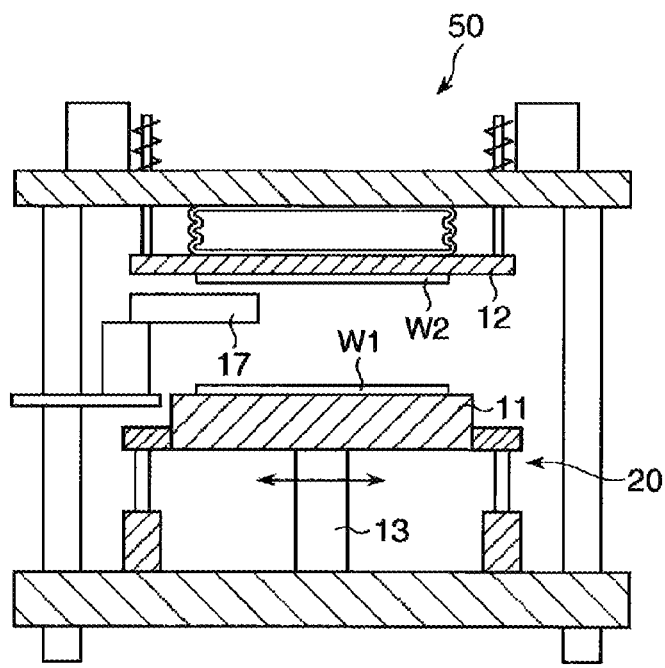
FIG. 8 is a longitudinal sectional view showing a schematic configuration of a joining device according to a second embodiment of the present disclosure.

FIG. 8 is a longitudinal sectional view showing a schematic configuration of a joining device according to a second embodiment of the present disclosure.

In FIG. 8, the joining device 50 according to the second embodiment is different from the joining device 10 of FIG. 1 in that the lower chuck 11 is supported slidably in a horizontal direction by a support member 13, and that a position adjustment mechanism 20 is installed adjacent to the lower chuck 11, and thus the lower chuck 11 or the wafer W1 held by the lower chuck 11 is aligned relative to the upper chuck 12 or the wafer W2 held by the upper chuck 12. Remaining configurations of the second embodiment are the same as the configurations of the embodiment described above (see FIG. 1) and function in a same way.

According to the present embodiment, the position adjustment mechanism 20 is installed adjacent to the lower chuck 11. Thus, the correction of the position is performed by pressing the lower chuck 11 to a side to which the lower chuck 11 is required to move. Therefore, it is possible to align the position of the wafer W1 held by the lower chuck 11 relative to the wafer W2 held by the upper chuck 12. Thus, it is possible to obtain the joined body 30 having high quality without the horizontal deviation and the angle deviation.

Figure 9:
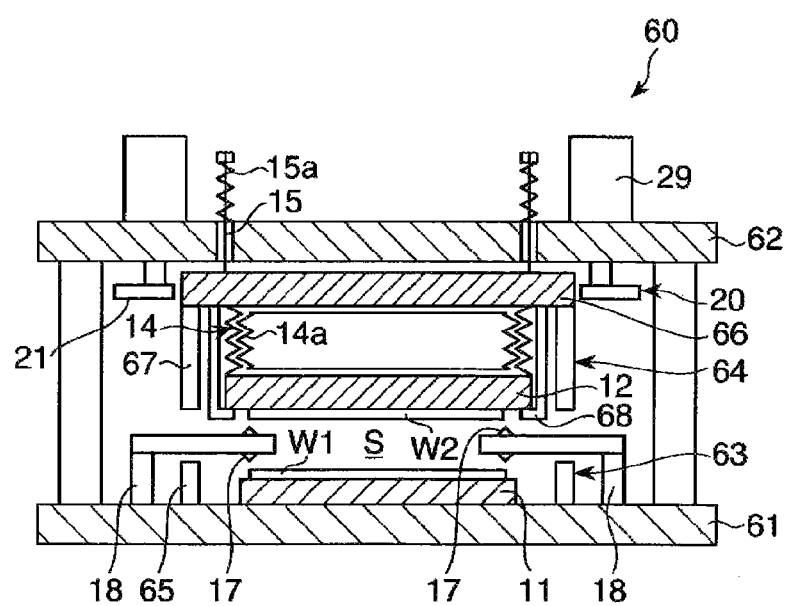
FIG. 9 is a longitudinal sectional view showing a schematic configuration of a joining device according to a third embodiment of the present disclosure.

FIG. 9 is a longitudinal sectional view showing a schematic configuration of a joining device according to a third embodiment of the present disclosure. The basic configurations of the joining device of the third embodiment are the same as those of the first embodiment described above except that the joining device of the third embodiment includes a joining chamber including a top chamber and a bottom chamber. Therefore, the same members are denoted by the same reference numerals and the description thereof will be omitted. The following description will focus on the difference from the joining device according to the first embodiment.

In FIG. 9, the joining device 60 includes as its main components a bottom support plate 61, a top support plate 62 facing the bottom support plate 61, a joining chamber provided between the top support plate 62 and the bottom support plate 61 and including a bottom chamber 63 and a top chamber 64 configured to come into contact with the bottom chamber 63, a lower chuck 11 disposed within the bottom chamber 63 and a upper chuck 12 disposed within the top chamber 64.

The bottom chamber 63 includes as its main components the bottom support plate 61 and a side wall 65 having, for example, a cylindrical shape and disposed on the top surface of the bottom support plate 61. The lower chuck 11 is disposed within a space surrounded by the bottom support plate 61 and the side wall 65. In addition, the top chamber 64 includes as its main components a top plate 66 of a disk-shaped member suspended from the top support plate 62 and supported by the suspension wires 15 and a side wall 67 having, for example, a cylindrical shape surrounding the outer peripheral portion of a bottom surface of the top plate 66. The upper chuck 12 is supported, at its bottom surface, by a plurality of, e.g., three hook-shaped members 68 disposed within the space surrounded by top plate 66 and the side wall 67 at equal intervals along an inner peripheral surface of the side wall 67, top end portions of the hook-shaped members 68 being supported at the top plate 66. With this configuration, the position of the upper chuck 12 relative to the top plate 66 is determined.

A plurality of, for example, three suspension wires 15 are disposed at equal intervals along the circumferential direction of the top plate 66. The suspension wires 15 can be elastically moved in a vertical direction by the spring member 15a, respectively. By using the suspension wires 15 as the suspension mechanism of the top plate 66, a position of the top plate 66 relative to the top support plate 62 is not fixed, while the top plate 66 can slightly move in a horizontal direction and can rotate by a predetermined angle, for example, about 0.4 degrees, about a center of a circular shape of the top plate 66 as a center of rotation.

A pressurization mechanism 14 having a cylindrical-shaped flexible container 14a is installed between the upper chuck 12 and the top plate 66. The pressurization mechanism 14 is used in joining the wafer W2 held by the upper chuck 12 to the wafer W1 held by the lower chuck 11. By introducing a pressurized fluid to the flexible container 14a, the pressurization mechanism 14 expands downward to press the upper chuck 12 toward the lower chuck 11.

A position adjustment mechanism 20 is installed adjacent to the outer peripheral surface of the top plate 66. The position adjustment mechanism 20 has a plurality of, for example, four cam members 21 driven by motors 29 as a driving source disposed on the top of the top support plate 62, respectively.

A decompression mechanism (not shown) is installed at the upper chuck 12, which decompresses the joining space surrounded by the lower chuck 11, the upper chuck 12 and an O ring (not shown) installed along the outer peripheral portion of the bottom surface of the upper chuck 12, in joining the wafer W1 and the wafer W2. The decompression mechanism depressurizes the joining space in joining the wafer W1 and the wafer W2.

A surveillance camera 17 as a deviation amount measurement mechanism is installed within a space S between the lower chuck 11 and the upper chuck 12, which measures the amount of position deviation between the position of the wafer W1 held by the lower chuck 11 and the position of the wafer W2 held by the upper chuck 12. A well-known camera is applied as the surveillance camera 17.

The surveillance camera 17 is installed such that it can advance to the space S and retract from the space S by a support base 18. After the wafer W1 is held by the lower chuck 11 and the wafer W2 is held by the upper chuck 12, the surveillance camera 17 is advanced to the interior of the space S to measure the deviation amount between the wafer W1 and the wafer W2, and then is moved back from the interior of the space S.

In the joining device 60 having this configuration, the joining position in joining the wafer W1 to the wafer W2 is adjusted as follows.

That is, in the initial state where the bottom chamber 63 and the top chamber 64 are separated from each other, in the same way as the first embodiment, the position alignment of the upper chuck 12 relative to the lower chuck 11 is performed, and then, the wafer W1 is carried into the joining device 60 to load the wafer W1 on the top surface of the lower chuck 11 and the wafer W2 is carried into the joining device 60 to suction-hold the wafer W2 on the bottom surface of the upper chuck 12. Thereafter, the top plate 66 is displaced in the horizontal direction by operating the position adjustment mechanism 20 in the same way as the first embodiment described above and thus, the upper chuck 12 disposed within the top chamber 64 is displaced in the horizontal direction. In this manner, the position alignment of the wafer W2 held by the upper chuck 12 relative to the wafer W1 held by the lower chuck 11 disposed within the bottom chamber 63 is performed.

After the position alignment of the wafer W2 relative to the wafer W1 is finished (at this time, the surveillance camera 17 is being moved back from the space S), for example, the bottom support plate 61 is moved toward the top support plate 62 by an elevating mechanism (not shown). Thus, the bottom chamber 63 is in contact with the top chamber 64 to form the joining chamber. Next, the lower chuck 11 is moved toward the upper chuck 12 by another elevating mechanism, thereby forming the joining space. Thereafter, the pressure in the joining chamber and the pressure in the joining space are adjusted as necessary, and then by introducing, for example, a compressed air as the pressurized fluid to the flexible container 14a, the flexible container 14a expands downward to press the upper chuck 12 toward the lower chuck 11. Thus, the wafer W2 is joined to the wafer W1.

According to the embodiment, by displacing the wafer W2, which is held by the upper chuck 12 disposed within the top chamber 64 supported by the top support plate 62 in the horizontal direction, together with the top plate 66, using the position adjustment mechanism 20, it is possible to perform the position alignment of the wafer W2 relative to the wafer W1 held by the lower chuck 11 disposed within the bottom chamber 63. Thus, it is possible to remove the position deviation between the wafer W1 and the wafer W2 in the joined body having the wafer W1 joined to the wafer W2, and to obtain the joined body having a high quality.

The present disclosure has been described in detail with reference to the embodiments. However, it should be noted herein that the present disclosure is not limited thereto.

What is claimed:

1. A joining device for joining a first member and a second member having a plate shape, the joining device comprising:
    a first holding unit configured to load and hold the first member on its top surface;
    a second holding unit disposed above the first holding unit while facing the first holding unit and configured to hold the second member; and
    a position adjustment mechanism configured to adjust a joining position between the first member held by the first holding unit and the second member held by the second holding unit,
    wherein the second holding unit is of a circular plate shape, and the position adjustment mechanism includes four position-adjusting cam members disposed at equal intervals along an outer peripheral surface of the second holding unit, and moves the second holding unit in a horizontal direction,
    wherein the position adjustment mechanism further includes an angle-adjusting cam member configured to press a protrusion formed on the outer peripheral surface of the second holding unit to rotate the second holding unit in a horizontal plane about a center of the circular shape of the second holding unit as a center of rotation, and
    wherein the position-adjusting cam member and the angle-adjusting cam member include:

a cylindrical outer peripheral ring;
a columnar eccentric cam provided in the outer peripheral ring through a bearing set; and
a drive shaft configured to drive the eccentric cam.

2. The joining device of claim 1, wherein the position-adjusting cam members are configured to adjust a horizontal position of the second holding unit in such a way that adjacent two position-adjusting cam members as a unit are contacted with or separated from the second holding unit.

3. The joining device of claim 1, wherein the first holding unit is of a circular plate shape, and
wherein the position adjustment mechanism includes four position-adjusting cam member disposed at equal intervals along an outer peripheral surface of the first holding unit, and moves the first holding unit in a horizontal direction.

4. The joining device of claim 3, wherein the position-adjusting cam members are configured to adjust a horizontal position of the first holding unit in such a way that adjacent two position-adjusting cam members as a unit are in contact with or separated from the first holding unit.

5. The joining device of claim 3, wherein the position adjustment mechanism further includes an angle-adjusting member configured to press a protrusion formed on an outer peripheral surface of the first holding unit to rotate the first holding unit in a horizontal plane about a center of the circular shape of the first holding unit as a center of rotation.

6. The joining device of claim 1, wherein the second holding unit is supported to a circular plate body, and
wherein the position adjustment mechanism includes four position-adjusting cam members disposed at equal intervals along an outer peripheral surface of the circular plate body, and moves the second holding unit by moving the circular plate body in a horizontal direction.

7. The joining device of claim 6, further comprising:
a joining chamber having a bottom chamber and a top chamber coming into contact with the bottom chamber, and
wherein the first holding unit and the second holding unit are installed within the bottom chamber and the top chamber, respectively, and the circular plate body is a top plate of the top chamber.

8. The joining device of claim 6, wherein the position-adjusting cam members are configured to adjust a horizontal position of the circular plate body in such a way that adjacent two position-adjusting cam members as a unit are in contact with or separated from the circular plate body.

9. The joining device of claim 6, wherein the position adjustment mechanism further includes an angle-adjusting member configured to press a protrusion formed on an outer peripheral surface of the circular plate body to rotate the circular plate body in a horizontal plane about a center of the circular shape of the circular plate body as a center of rotation.

10. The joining device of claim 1, further comprising:
a deviation amount measurement mechanism configured to measure a deviation amount of a joining position between the first member held by the first holding unit and the second member held by the second holding unit.

11. A joining position adjustment method of adjusting a joining position between a first member and a second member having a plate shape in joining the first member and the second member using a joining device, the joining device comprising:
a first holding unit configured to load and hold the first member on its top surface;
a second holding unit disposed above the first holding unit while facing the first holding unit and configured to hold the second member; and
a position adjustment mechanism configured to adjust a joining position between the first member held by the first holding unit and the second member held by the second holding unit, and
wherein the second holding unit is of a circular plate shape, and the position adjustment mechanism includes four position-adjusting cam members disposed at equal intervals along an outer peripheral surface of the second holding unit and an angle-adjusting cam member configured to press a protrusion formed on the outer peripheral surface of the second holding unit to rotate the second holding unit in a horizontal plane about a center of the circular shape of the second holding unit as a center of rotation,
the method comprising:
a member holding process of holding the first member and the second member to the first holding unit and the second holding unit, respectively;
a deviation amount measuring process of measuring a deviation amount of a position of the second member relative to a position of the first member;
a cam separating process of driving adjacent two position-adjusting cam members among the four position-adjusting cam members at a side to which the second member should be moved, to separate the adjacent two position-adjusting cam members from the outer peripheral surface of the second holding unit, based on the measured deviation amount; and
a position aligning process of aligning the position of the second member relative to the first member by driving the remaining adjacent two position-adjusting cam members disposed opposite the separated position-adjusting cam members, to press and move the second holding unit, together with the second member held by the second holding unit, to the side the second member should be moved, to correct a horizontal deviation.

12. The method of claim 11, further comprising:
an angle adjusting process of rotating the second holding unit in a horizontal plane about the center of the circular shape of the second holding unit as a center of rotation by using the angle-adjusting cam member to correct an angle deviation of the second member relative to the first member, after the position aligning process.

13. The method of claim 11, further comprising:
a centering process of performing a position alignment of the second holding unit relative to the first holding unit by using the position-adjusting cam members, before the member holding process.

* * * * *